United States Patent
Zhou et al.

(10) Patent No.: US 10,290,362 B2
(45) Date of Patent: *May 14, 2019

(54) SCREENING FOR DATA RETENTION LOSS IN FERROELECTRIC MEMORIES

(71) Applicant: Texas Instruments Incorporated, Dallas, TX (US)

(72) Inventors: Carl Z. Zhou, Plano, TX (US); John A. Rodriguez, Dallas, TX (US); Richard A. Bailey, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/837,451

(22) Filed: Dec. 11, 2017

(65) Prior Publication Data

US 2018/0102184 A1   Apr. 12, 2018

Related U.S. Application Data

(63) Continuation of application No. 14/857,873, filed on Sep. 18, 2015, now Pat. No. 9,842,662.

(60) Provisional application No. 62/116,644, filed on Feb. 16, 2015.

(51) Int. Cl.
  *G11C 11/22*  (2006.01)
  *G11C 29/50*  (2006.01)

(52) U.S. Cl.
  CPC .. *G11C 29/50016* (2013.01); *G11C 29/50008* (2013.01); *G11C 11/2275* (2013.01)

(58) Field of Classification Search
  None
  See application file for complete search history.

(56) References Cited

U.S. PATENT DOCUMENTS

| | | | |
|---|---|---|---|
| 6,175,528 B1* | 1/2001 | Kye | G11C 29/789 365/145 |
| 7,149,137 B2 | 12/2006 | Rodriguez et al. | |
| 7,813,193 B2 | 10/2010 | Rodriguez et al. | |
| 9,607,717 B2 | 3/2017 | Bailey et al. | |
| 9,842,662 B2* | 12/2017 | Zhou | G11C 29/50016 |
| 2003/0227809 A1 | 12/2003 | Schwartz | |
| 2005/0103980 A1 | 5/2005 | Schultz et al. | |
| 2006/0033516 A1 | 2/2006 | Rincon et al. | |
| 2006/0104133 A1 | 5/2006 | Norma | |

* cited by examiner

*Primary Examiner* — J. H. Hur

(74) *Attorney, Agent, or Firm* — Kenneth Liu; Charles A. Brill; Frank D. Cimino

(57) ABSTRACT

A data retention reliability screen of integrated circuits including ferroelectric random access memory (FRAM) arrays. Sampled groups of cells in the FRAM array are tested at various reference voltage levels, after programming to a high polarization capacitance data state and a relaxation time at an elevated temperature. Fail bit counts of the sample groups at the various reference voltage levels are used to derive a test reference voltage, against which all of the FRAM cells in the integrated circuit are then tested after preconditioning (i.e., programming) and another relaxation interval at the elevated temperature, to determine those cells in the integrated circuit that are vulnerable to long-term data retention failure.

18 Claims, 7 Drawing Sheets

SCREENING FOR DATA RETENTION LOSS IN FERROELECTRIC MEMORIES

CROSS-REFERENCE TO RELATED APPLICATIONS

This application is a continuation of and claims priority to U.S. patent application Ser. No. 14/857,873, filed on Sep. 18, 2015 (now U.S. Pat. No. 9,842,662), which claims priority, under 35 U.S.C. § 119(e), to U.S. Provisional Application No. 62/116,644, filed Feb. 16, 2015, incorporated herein by this reference.

STATEMENT REGARDING FEDERALLY SPONSORED RESEARCH OR DEVELOPMENT

Not applicable.

BACKGROUND

This invention is in the field of integrated circuit electrical testing. Embodiments of this invention are more specifically directed to the screening of integrated circuits including ferroelectric cells that are potentially of weak long term reliability.

Conventional metal-oxide-semiconductor (MOS) and complementary MOS (CMOS) logic and memory devices are prevalent in modern electronic systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example placing capacitors above the transistor level, between overlying levels of metal conductors.

Ferroelectric technology is now utilized in non-volatile solid-state read/write random access memory (RAM) devices. These memory devices, commonly referred to as "ferroelectric RAM", or "FeRAM", or "FRAM" devices, are now commonplace in many electronic systems, particularly portable electronic devices and systems. FRAMs are especially attractive in implantable medical devices, such as pacemakers, defibrillators, and monitoring devices, due to the ultra-low power consumption of FRAM memory. Various memory cell architectures including ferroelectric capacitors are known in the art, including the well-known 2T-2C (two transistor, two capacitor) cells in which the two ferroelectric capacitors in a cell are polarized to complementary states. Another type of FRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors. Ferroelectric cells constructed in a 1T-1C (one transistor, one capacitor) arrangement, similar to conventional dynamic RAM memory cells, are attractive because of their small chip area, but at a cost of less robust read performance than the latching but larger area 2T-2C and 6T cell types.

FIG. 1a illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "-1" state, and will exhibit a stored charge of $-Q_2$ for applied voltage V below $+V_\alpha$.

An important characteristic of ferroelectric capacitors, for purposes of non-volatile storage in integrated circuits, is the difference in capacitance exhibited by a ferroelectric capacitor between its polarized states. As fundamental in the art, the capacitance of an element refers to the ratio of stored charge to applied voltage. While the ferroelectric capacitor has a linear capacitance, by virtue of its construction as parallel plates separated by a dielectric film (i.e., the ferroelectric material), it also exhibits significant polarization capacitance (i.e., charge storage) in response to changes in polarization state that occurs upon application of a polarizing voltage. For example, referring to FIG. 1a, the polarization of a ferroelectric capacitor from its "-1" state to its "+1" state is reflected in a relatively high capacitance C(-1), reflecting the storage of polarization charge in the capacitor in response to the change of polarization state by the voltage exceeding coercive voltage $V_\alpha$. On the other hand, a capacitor that already in its "+1" state exhibits little capacitance C(+1) due to polarization, since its ferroelectric domains are already aligned in the direction of the applied coercive voltage, causing little additional polarization charge to be stored. As will be evident from the following description, a stored logic state is read by interrogating the capacitance of the ferroelectric capacitors to discern its polarization state.

By way of further background, it has been observed that the polarization properties of conventional ferroelectric capacitors are quite sensitive to the presence of hydrogen. More specifically, the infiltration of hydrogen into the ferroelectric film is believed to cause degradation in the hysteresis characteristic of the ferroelectric capacitor. In FRAM memory applications, this degradation is exhibited by weakened data retention, also referred to as "imprint degradation", particularly for the "-1" polarization state according to the nomenclature of FIG. 1a.

FIG. 1b illustrates, in cross-section, a typical construction of a portion of an integrated circuit including a ferroelectric capacitor and an n-channel metal-oxide-semiconductor (MOS) transistor. In this arrangement, a MOS transistor is realized at the surface of p-type substrate 10 (or well), at an active region disposed between isolation dielectric structures 15 formed by shallow trench isolation in this example. N+ source/drain regions 14 are formed into substrate 10 on opposing sides of polysilicon gate element 16 in a self-aligned manner. Gate element 16 is separated from the surface of the active region by gate dielectric 17, thus forming the transistor. Sidewall spacers 19 are provided on the sides of gate element 16 as useful in forming source/drain region extensions, as known in the art. A ferroelectric capacitor is formed in this structure by a ferroelectric stack including conductive plates 20a, 20b (formed of an elemental metal, or a conductive metal compound such as a metal nitride, conductive metal oxide, or a silicide, or a stack of two or more of these layers) between which ferroelectric material 22 is disposed. In this example, ferroelectric material 22 consists of PZT. Bottom conductive plate 20a is connected to the source/drain region 14 by conductive plug 18 formed into a contact opening etched through dielectric film 13.

Conventional process flows for manufacturing ferroelectric capacitors such as shown in FIG. 1b have addressed the issue of hydrogen contamination of the ferroelectric material by depositing passivation films over the ferroelectric capacitor structure. For example, referring to FIG. 1b, multiple passivation films are formed over the ferroelectric stack to inhibit hydrogen contamination of ferroelectric material 22. In this conventional example, aluminum oxide layer 24 is formed over the ferroelectric stack, for example to a thickness of about 25 nm, and serves both as a hydrogen barrier and also as a chemical barrier between ferroelectric material 22 and the other passivation films. Silicon nitride layer 25 is formed over aluminum oxide layer 24, for example to a thickness of about 50 nm, by high-density plasma (HDP), followed by a second silicon nitride film 26, deposited by chemical vapor deposition (CVD) to a thickness (e.g., about 50 nm) sufficient to fill any gaps or thin spots (i.e., voids) in HDP nitride 25, and which increases the thickness of the overall passivation layer. However, long-term reliability testing shows that some portion of the population of integrated circuits including FRAM cells remain vulnerable to depolarization over time, despite this passivation.

By way of further background, copending and commonly assigned U.S. application Ser. No. 14/519,894, filed Oct. 21, 2014 and incorporated herein by reference, describes a data retention reliability screen of FRAM cells in which a reference voltage level for the read of a high polarization capacitance data state (e.g., a "1" state) is determined for each integrated circuit being tested. A number of FRAM cells in the integrated circuit are programmed to the "1" data state, and then read at an elevated temperature. The number of failing cells is compared against a pass/fail threshold to determine whether that integrated circuit is vulnerable to long-term data retention failure.

SUMMARY

Disclosed embodiments provide a method of performing a time-zero screen of integrated circuits including ferroelectric memory cells that detects those cells and circuits that will exhibit weakened data retention.

Disclosed embodiments provide such a method that can be performed on integrated circuits in wafer form.

Disclosed embodiments provide such a method that can be implemented without necessitating changes to design of the ferroelectric memory.

Other objects and advantages of the disclosed embodiments will be apparent to those of ordinary skill in the art having reference to the following specification together with its drawings.

According to certain embodiments, a method of testing integrated circuits that each include ferroelectric memory cells, for example in the form of 1T-1C ferroelectric random access memory (FRAM) cells arranged in an array, for potential data retention failures is implemented by programming a plurality of its FRAM cells to a first data state (e.g., a "0" data state), and then subjecting the integrated circuits to a high temperature bake. Each integrated circuit is then electrically tested at an elevated temperature by first programming a second data state (e.g., a "1" data state) into each cell, pausing for a specified time at the elevated temperature, and then reading a plurality of sample groups of cells at various reference voltage levels to determine a number of failed bits over a plurality of reference voltages. A test reference voltage level is calculated for that integrated circuit from the failed bit counts, and all cells of the integrated circuit are then programmed and, after a pause, read at that test reference voltage.

DETAILED DESCRIPTION OF THE INVENTION

The one or more embodiments described in this specification are implemented into the manufacturing testing of ferroelectric random access memories (FRAMs), as it is contemplated that such implementation is particularly advantageous in that context. However, it is also contemplated that concepts of this invention may be beneficially applied to other applications, for example to integrated circuits including ferroelectric elements of other types beyond memory cells, or in the characterization or other test applications applied to FRAMs and other ferroelectric devices. Accordingly, it is to be understood that the following description is provided by way of example only, and is not intended to limit the true scope of this invention as claimed.

Figure 2A:
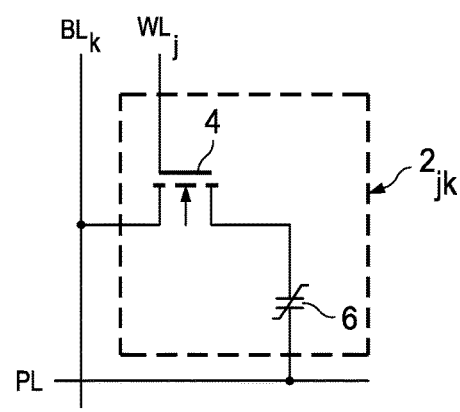
FIGS. 2a and 2b are electrical diagrams, in schematic and block form, illustrating a conventional 1T-1C ferroelectric memory cell and its operation.

FIG. 2a illustrates a typical arrangement of a conventional 1T-1C FRAM cell, in connection with which embodiments described herein may be used. Electrically, as shown in FIG. 2a, FRAM cell $2_{jk}$ represents a single cell in an array of similar cells 2, residing in row j and column k of that array. Cell $2_{jk}$ includes n-channel pass transistor 4 and ferroelectric capacitor 6. The source/drain path of transistor 4 is connected between bit line $BL_k$ for column k of the array, and the top plate of ferroelectric capacitor 6; the gate of transistor 4 is controlled by word line $WL_j$ for row j of the array. The bottom plate of ferroelectric capacitor 6 is connected to plate line PL, which may be in common for all cells 2 in the array (or in a particular portion of the array, depending on the architecture). In operation, selection of row j causes word line $WL_j$ to be energized, turning on transistor 4 in cell $2_{jk}$ (and in all of cells 2 in row j), which connects the top plate of capacitor 6 to bit line $BL_k$. Sense circuitry coupled to bit line $BL_k$ is then able to sense the polarization state of ferroelectric capacitor 6, as will be discussed below.

Figure 1A:
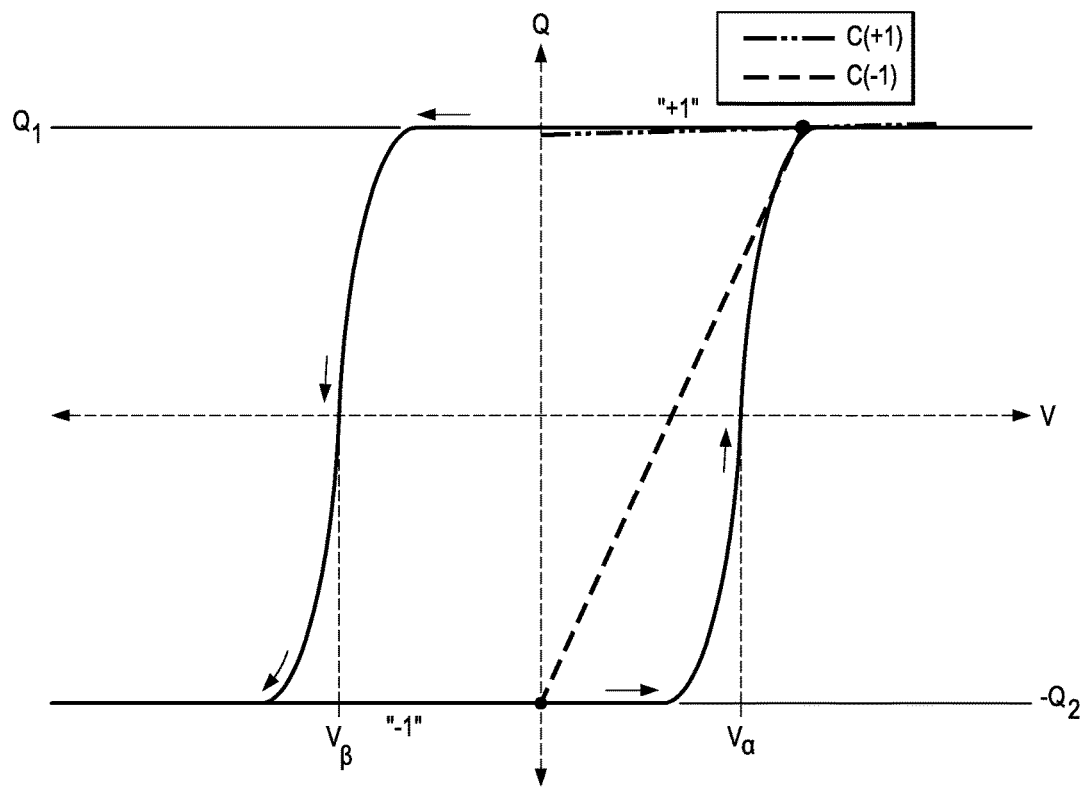
FIG. 1a is a plot of a charge-vs.-voltage characteristic of a conventional ferroelectric capacitor.
Figure 1B:
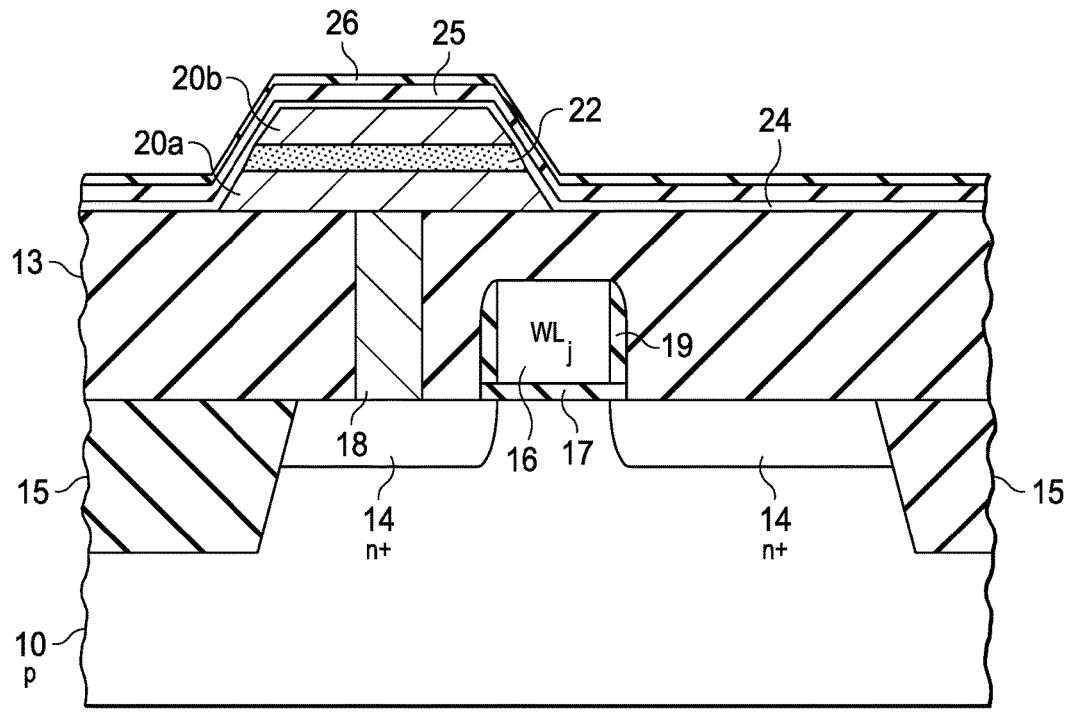
FIG. 1b is a cross-sectional view illustrating a portion of an integrated circuit including a ferroelectric capacitor constructed according to conventional methods.

One way in which cell $2_{jk}$ of FIG. 2a may be realized is by way of a structure such as shown in FIG. 1b discussed above. Referring to that FIG. 1b, n-channel MOS transistor 4 is realized by N+ source/drain regions 14 on opposing sides of polysilicon gate element 16, with gate element serving as word line $WL_j$ and one of source/drain regions 14 serving as bit line $BL_k$. Ferroelectric capacitor 6 of cell $2_{jk}$ is implemented by the ferroelectric stack of conductive plates 20a, 20b disposed below and above, respectively, ferroelectric material 22 formed of PZT. Bottom conductive plate 20a is connected to the source/drain region 14, and thus to transistor 4, by conductive plug 18 through dielectric film 13.

As known in the art, for 1T-1C memory cells such as that of FIG. 2a that are sensed by applying a voltage across ferroelectric capacitor 6, between bit line $BL_k$ and plate line PL with pass transistor 4 turned on, the polarization state that exhibits the higher capacitance when sensed is typically considered as the "1" data state. In this example, the sensing operation corresponds to that illustrated in the hysteresis diagram of FIG. 1a, in which the polarization state is sensed by applying a positive voltage across ferroelectric capacitor 6. Accordingly, in this description, ferroelectric capacitor 6 of 1T-1C FRAM cell $2_{jk}$ in its "−1" polarization state (i.e., exhibiting the higher capacitance C(−1) state shown in FIG. 1a) will be considered as the "1" data state, and the "+1" polarization state (lower capacitance C(+1) state) of capacitor 6 will be considered as the "0" data state of cell $2_{jk}$. In operation, cell $2_{jk}$ is programmed by applying voltages to plate line PL and bit line $BL_k$ that, with word line $WL_j$ energized, polarizing capacitor 6 into the desired polarization state. In this example, a "0" data state corresponding to the "+1" polarization state of FIG. 1a is written by the application of a low voltage ($V_{ss}$) to bit line $BL_k$, turning on word line $WL_j$, and then raising plate line PL to a high voltage ($V_{cc}$). Conversely, a "1" data state corresponding to the "−1" polarization state is written by the application of a low voltage ($V_{ss}$) to plate line PL, turning on word line $WL_j$, and then raising bit line $BL_k$ to a high voltage ($V_{cc}$).

Figure 2B:
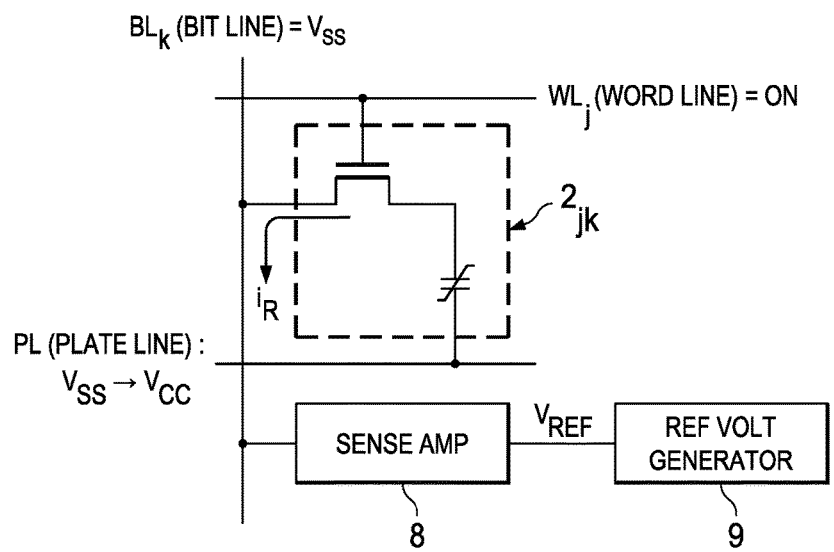
Figure 2C:
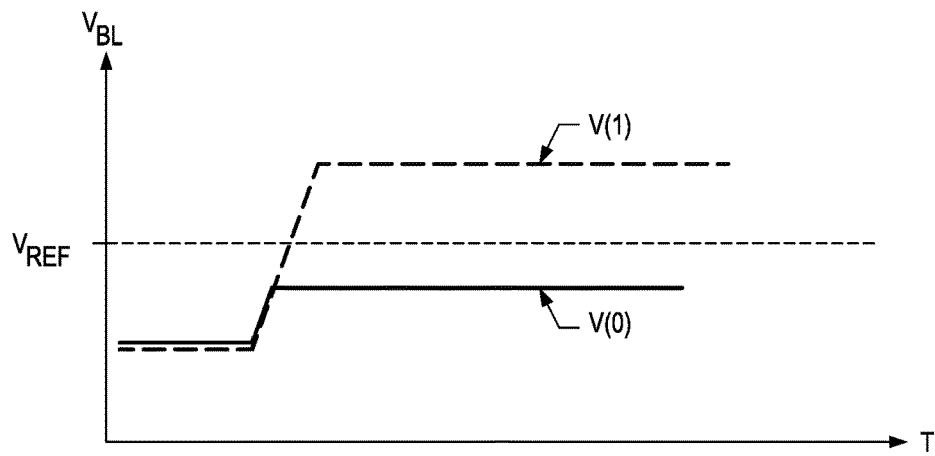
FIG. 2c is a timing diagram illustrating the operation of a read of the 1T-1C ferroelectric memory cell of FIGS. 2a and 2b.

FIGS. 2b and 2c illustrate the read operation of FRAM cell $2_{jk}$. As shown in FIG. 2b, the read is performed by applying a low voltage $V_{ss}$ to bit line $BL_k$, and then raising the voltage of plate line PL from the low voltage $V_{ss}$ to the high voltage $V_{cc}$ with word line $WL_j$ energized and transistor 4 turned on. The raising of the voltage at plate line PL and the lower plate of capacitor 6 interrogates the polarization capacitance of capacitor 6, according to the hysteresis diagram of FIG. 1a, specifically by way of sensing the level of read current $i_R$ conducted by cell $2_{jk}$ via bit line $BL_k$. Sense amplifier 8, which is coupled to bit line $BL_k$ will effectively compare a voltage induced by read current $i_R$ to a reference voltage $V_{REF}$ generated by reference voltage generator circuit 9 to discern the stored data state. As shown in FIG. 2c, if capacitor 6 is in the "+1" polarization state, read current $i_R$ will be relatively low, exhibited by a relatively low level ($<V_{REF}$) voltage transition V(0) that is interpreted by sense amplifier 8 as a "0" data state. Conversely, if capacitor 6 is in the "−1" polarization state, read current $i_R$ will be relatively strong and will result in a relatively high level ($>V_{REF}$) voltage transition V(1) that is interpreted by sense amplifier 8 as the "1" data state. In this arrangement, the read of the "1" data state is destructive, because the read operation essentially programs cell $2_{jk}$ into the opposite data state; a write-back operation is they typically performed to return cell $2_{jk}$ to its previous polarization state.

It has been observed from long-term reliability testing that some number of FRAM devices remain vulnerable to depolarization over time. This depolarization is reflected in data retention failures during long-term (~1000 hour) high temperature bake. These data retention failures are believed to be due to non-uniformity of the hydrogen barrier films, variations in hydrogen exposure over the device population, or other physical defects in the PZT capacitor, each of which can result in infiltration of hydrogen into ferroelectric material and thus degradation in the hysteresis characteristic of ferroelectric capacitors incorporating that material. In FRAM memory applications, this degradation, which is also referred to as "imprint degradation", is exhibited by weakened data retention for the polarization state that exhibits higher capacitance when sensed by application of the sensing voltage. In a sensing operation that applies a positive polarity voltage across the capacitor, as in FIG. 1a, it is the "−1" polarization state that has the higher capacitance C(−1), and that exhibits weakened data retention due to this mechanism. In cell $2_{jk}$ of FIGS. 2a and 2b, this higher capacitance ("−1") polarization state corresponds to the "1" data state, and so the weakened data retention will appear as degraded read margin for the "1" data state. 2T-2C FRAM cells are less susceptible to this type of data retention failure than are 1T-1C FRAM cells, because of the larger read margin resulting from the differential read signal of 2T-2C cells. Indeed, it is believed that data retention performance continues, to some extent, to limit the use of 1T-1C FRAM memories for many applications.

Figure 3A:
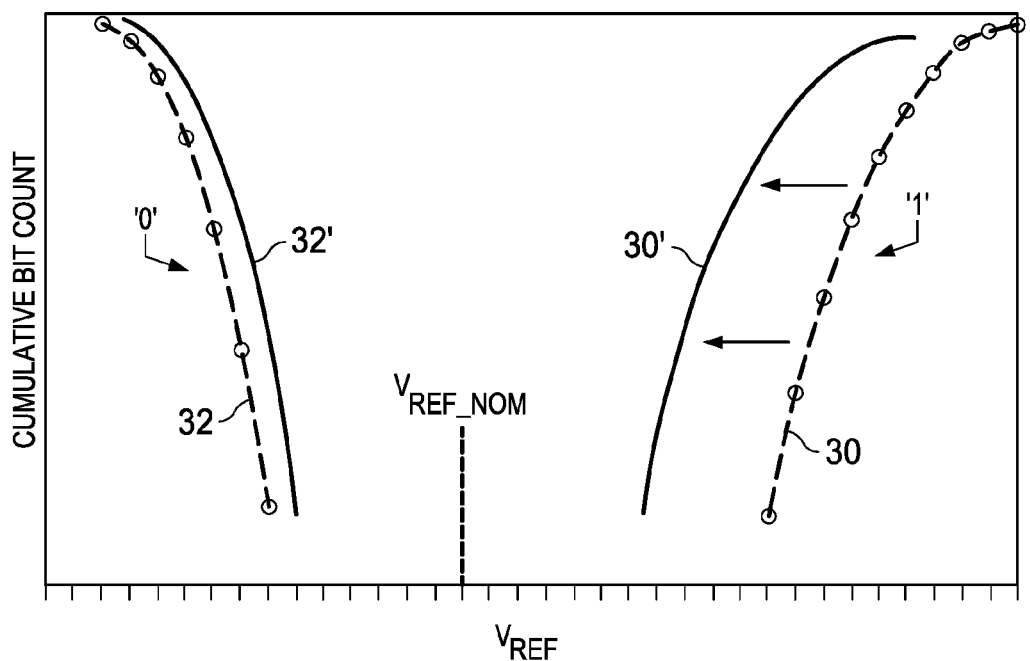
FIG. 3a illustrates plots of cumulative bit fail distribution for an integrated circuit including a 1T-1C ferroelectric random access memory (FRAM) versus reference voltage level.

FIG. 3a illustrates the behavior of this mechanism of read margin degradation for an array of FRAM cells $2_{jk}$ constructed as described above relative to FIGS. 2a and 2b. The plots of FIG. 3a are in the form of plots of a cumulative failed bit count with varying levels of reference voltage $V_{REF}$ generated by reference voltage generator circuit 9 and applied to sense amplifier 8 of FIG. 2c in the read operation, for the "0" and "1" programmed data states and before and after a long term data retention bake. Reference voltage $V_{REF\_NOM}$ illustrates a nominal reference voltage, for example as used in normal operation of the memory, from which reference voltage $V_{REF}$ varies in deriving the plots shown. Specifically, plots 30, 30' illustrate the cumulative number of bits in the array that are programmed to a "1" data state, but return the incorrect "0" data state when read, with increasing reference voltage $V_{REF}$; plot 30 illustrates this performance for a single FRAM array prior to a data retention bake, and plot 30' illustrates this performance for the same array after a data retention bake of 1000 hours at 125 deg C. Similarly, plots 32, 32' show the cumulative number of failures of bits that are programmed to a "0" data state, prior to and after data retention bake, respectively, as reference voltage $V_{REF}$ decreases.

As evident from the shift from plot 30 to plot 30' in FIG. 3a, the data retention bake causes degradation of the "1" data state, which corresponds to the polarization state ("−1" in this case) exhibiting the larger capacitance in the sensing operation. Conversely, the lower polarization capacitance "0" data state ("+1" polarization state) exhibits a much lower shift due to the data retention bake, from plot 32 to plot 32'; loss of polarization due to hydrogen contamination has a lesser effect where the read voltage is of the same polarity as the polarization state.

Figure 3B:
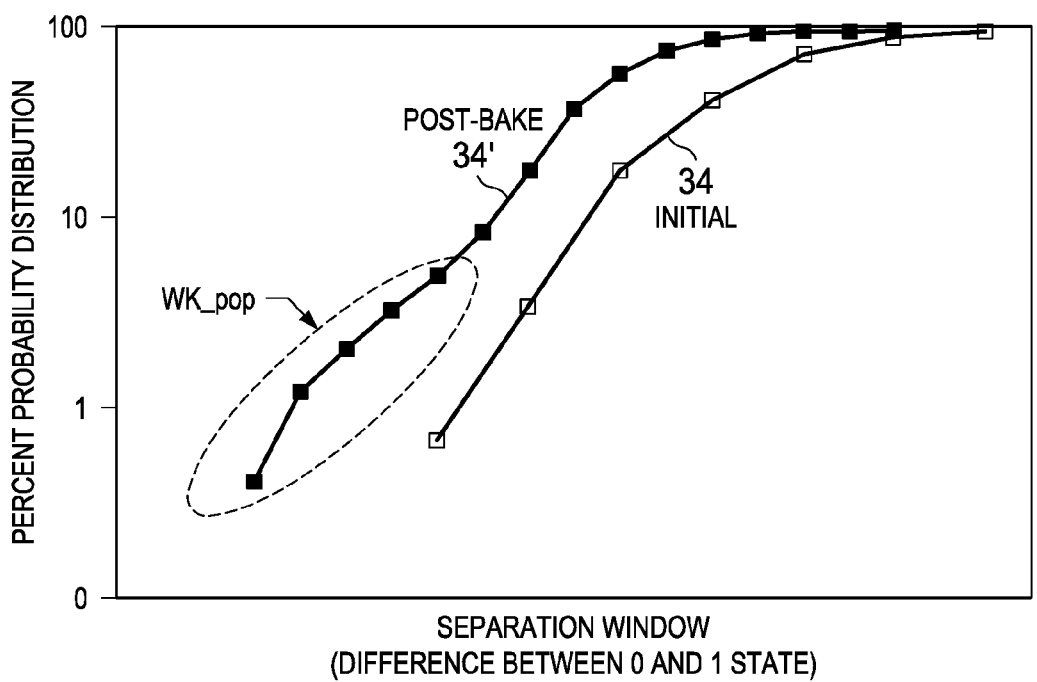
FIG. 3b illustrates plots of failure distribution of a population of integrated circuits including 1T-1C FRAM memories versus separation window.

While FIG. 3a illustrates the cumulative failed bits within a single FRAM array, FIG. 3b illustrates the probability distribution of a population of integrated circuits that each include FRAM memory arrays, before and after a long term data retention bake. The horizontal axis of plots 34, 34' corresponds to a separation window, namely the voltage differential between "0" and "1" data states exhibited by each individual integrated circuit die in the population (in wafer form), with the vertical axis corresponding to a cumulative percent probability distribution of the integrated circuits in the population. Plot 34 is the probability distribution plot for the population prior to the data retention bake, and plot 34' is the probability distribution plot for the same population following a data retention bake of 1000 hours at 125 deg C.

As evident from FIG. 3b, not only does the separation window shift for the entire population as a result of the data retention bake, but a portion WK_pop of that population exhibits a greater degradation in the separation window as a result of the data retention bake, with a slope in its failure distribution differing from that of the remainder of the population. It is believed that the integrated circuits in this weaker portion WK_pop of the overall population present a greater risk of failure in the field over operating life than the remainder of the population. As mentioned above, because FRAM cells of the 1T-1C type are more vulnerable to this type of data retention failure than are 2T-2C cells, this susceptibility limits the use of 1T-1C FRAM memories for many applications, at least to some extent. It is therefore desirable to remove these devices from the population in the manufacturing process.

The difficulty is, of course, identifying this weaker portion WK_pop of the population of FRAM devices at the time of manufacture. The duration of the long-term data retention bake that identifies these weak devices cannot be tolerated in the manufacturing flow, even on a sample basis. In addition, those devices that are subjected to the data retention bake, even if not in the weaker portion WK_pop, are aged by the process. While time-zero electrical testing in manufacture using a stringent reference voltage $V_{REF}$ for the "1" data state, namely close to the initial fail voltage of plot 30 of FIG. 3a, will eliminate those integrated circuits (also referred to herein as "devices") in the population that have the poorest read margin of the population, it has been observed that those devices are not necessarily the ones that exhibit the greatest shift in data retention bake. As a result, conventional time-zero electrical screening has been observed to both fail devices that do not exhibit the data retention vulnerability (false negatives) while passing devices that have the data retention vulnerability (false positives), resulting in yield loss while not improving reliability of the population.

As will be described according to the embodiments disclosed in this specification, a time zero electrical test method that identifies and screens integrated circuits for this data retention vulnerability, and that is suitable for implementation into the manufacturing test flow, is provided. It is contemplated that these embodiments can enable the use of 1T-1C FRAM cells in non-volatile memory applications, with acceptable data retention reliability.

Figure 4:
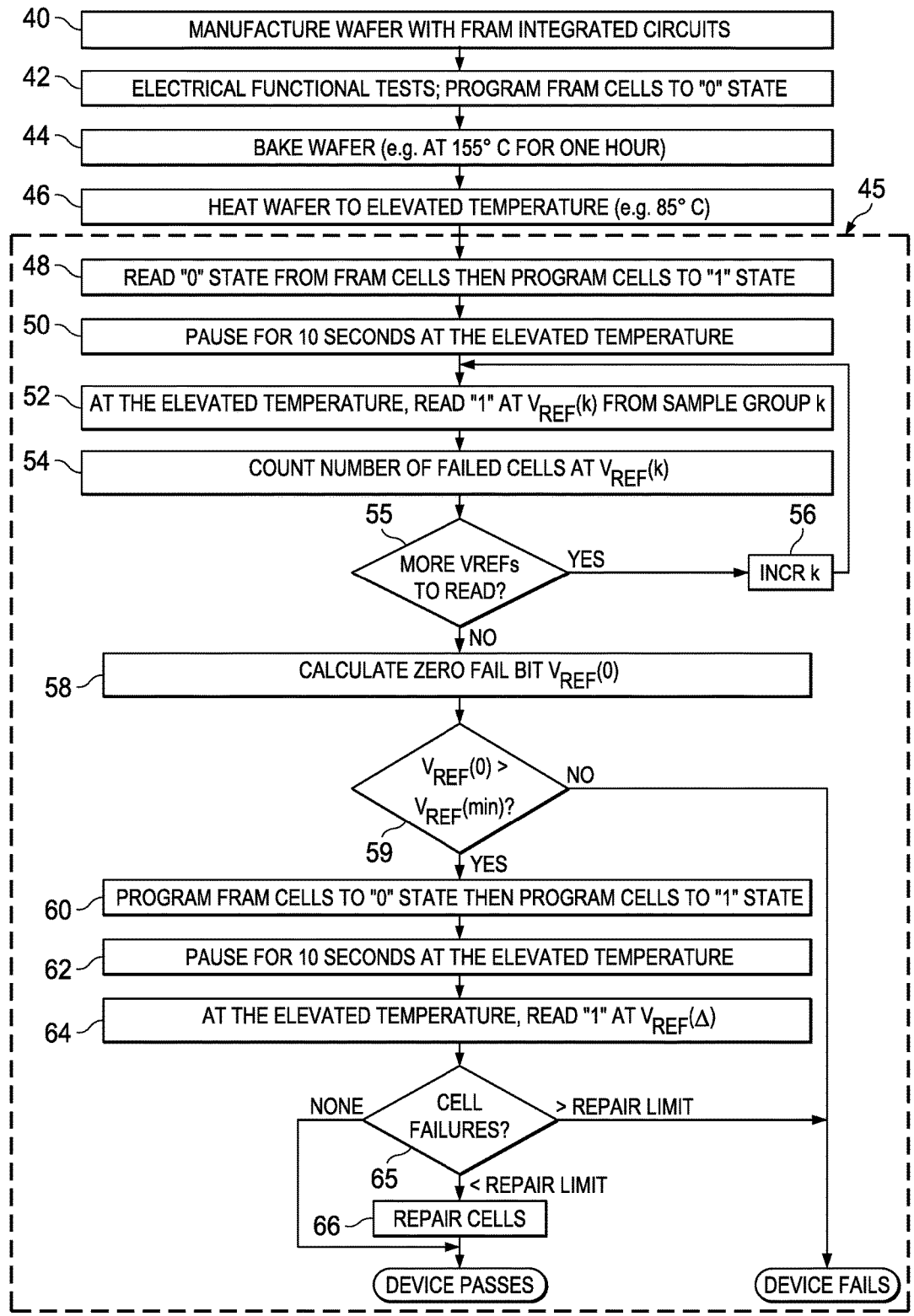
FIG. 4 is a flow diagram of a time-zero reliability screen according to an embodiment.

Referring now to FIG. 4, a method of performing a reliability screen for integrated circuits including FRAM cells, such as 1T-1C cells $2_{jk}$ described above, to identify those with weak data retention reliability will now be described in connection with an embodiment. According to this embodiment, this reliability screen is performed at a point in manufacture commonly referred to as "multiprobe" electrical testing of the integrated circuits in wafer form, as may be carried out using conventional electrical test equipment implemented at one or more conventional multiprobe test stations. As such, the reliability screen according to this embodiment follows process 40 in FIG. 4, in which integrated circuits including ferroelectric memory cells, arranged in a memory array, are formed at the surface of a semiconductor wafer in the conventional manner. It is contemplated that the particular arrangements and implementations of FRAM cells in the devices manufactured in process 40 may vary widely, for example as one or more FRAM memory arrays within a larger scale integrated circuit such as a microprocessor or microcontroller, or realized as a stand-alone FRAM memory integrated circuit. In addition, it is to be understood that the reliability screen of these embodiments may alternatively be performed, in whole or in part, on individual integrated circuits that are no longer in wafer form, whether packaged or not. However, it is contemplated that it will typically be advantageous to perform this screen on devices in wafer form to avoid the cost of packaging and otherwise processing devices that will not be suitable for end use.

The following description of the reliability screen according to this embodiment will be described with reference to a single integrated circuit (i.e., "die" on the wafer), for clarity of the description. As those skilled in the art having reference to this specification will readily recognize, it is of course contemplated that each die on the wafer manufactured in process 40 will be tested in the same manner, from process to process in this test flow, in the usual manner for electrical testing of circuits in wafer form. In addition, it is contemplated that the reliability screen of this embodiment, and of the other embodiments described in this specification, may be carried out using conventional electrical test equipment implemented at one or more conventional multiprobe test stations.

In process 42, electrical functional and parametric testing of the integrated circuits on the wafer is performed using conventional electrical test equipment implemented at one or more conventional multiprobe test stations. The particular tests performed as part of this process 42 that are directed to FRAM cells are contemplated to include typical functionality tests (write and read of both data states to all cells), tests of pattern sensitivity, address decoder functionality (e.g., the well-known "march" test), and performance tests such as evaluating read access times. In this embodiment, it is contemplated that functional test process 42 will be performed at room temperature (i.e., ≤30° C.), and using a nominal reference voltage (such as VREF_NOM shown in FIG. 3a) for its read operations. As part of functional test process 42, the FRAM cells of each die on the wafer are programmed to have a "0" state at the completion of functional test process 42. The "0" state programmed into the FRAM cells in process 42 according to this embodiment corresponds to the "+1" polarization state described above for capacitor 6 of cell $2_{jk}$, which is the polarization state that exhibits a lower polarization capacitance in a read operation. This "0" data state thus corresponds to the C(+1) state in the hysteresis diagram of FIG. 1a, when read by the application of a positive voltage across capacitor 6.

Following functional test process 42, the wafer including the programmed FRAM cells is subjected to a high temperature bake in process 44. Bake process 44 in this embodiment has been observed to activate the depolarization mechanism in the ferroelectric material of those FRAM capacitors that are likely to exhibit loss of polarization over the long term, at least to a greater extent than will be exhibited by stable cells in the overall population. It has been observed, in connection with this invention, that the temperature of bake process 44 must be relatively high in order to result in the desired effect. More specifically, it has been observed that a one hour bake at 85° C. does not adequately depolarize the suspect cells, and as such bake process 44 is performed at a temperature above 85° C. in this embodiment, for a duration of at least about twenty minutes. An example of the conditions for bake in process 44 is one hour at 155° C., for FRAM cells constructed according to a current-day technology in which the ferroelectric material is PZT.

Following bake process 44, second multiprobe test 45 is performed for each of the integrated circuits on the wafer, according to this embodiment. Second multiprobe test 45 is performed at an elevated temperature according to this embodiment, and as such the wafer is heated to an elevated temperature, for example a temperature above about 60° C., by placing the wafer on a heated multiprobe chuck at the multiprobe test station. In one implementation of this embodiment, the elevated temperature to which the wafer is heated in process 46 is about 85° C.

Second multiprobe test 45 will now be described as performed for a single integrated circuit die on the wafer. Of course, this second multiprobe test 45 will be repeated for each die on that same wafer (skipping any that were marked as failed in functional test process 42), while the wafer remains on the heated chuck, and thus at the elevated temperature, from process 46.

In process 48, the multiprobe test equipment "preconditions" FRAM cells in the die under test (the "DUT") by first reading the "0" state from each of the FRAM cells (for example at a nominal VREF), and then programming each of the FRAM cells to the "1" state. If any of the FRAM cells do not exhibit the "0" state when read in process 48 (or, alternatively, if more FRAM cells fail than can be repaired via redundancy), the die may be considered as failing at this point, and the rest of the tests need not be performed for that die. The programming of the "1" state carried out in process 48 may be performed in the normal manner for data "write" operations; it is contemplated that all of the FRAM cells of the DUT will be programmed to this "1" data state at this time. This "1" data state programmed into the FRAM cells in process 48 according to this embodiment corresponds to the "−1" polarization state described above for capacitor 6 of cell $2_{jk}$, which is the polarization state that exhibits the higher polarization capacitance, namely the C(−1) state shown in FIG. 1a, when read by the application of a positive voltage across capacitor 6.

According to this embodiment, following preconditioning process 48, a pause of at least about ten seconds with the wafer remaining on the heated chuck and thus at the elevated temperature is observed in process 50. It has been observed, in connection with this embodiment, that the depolarization of ferroelectric material in weakened FRAM cells occurs over a relaxation time following polarization. This depolarization has been observed to be time dependent, such that the pause of process 50 will enhance the drift of the programmed states in weakened FRAM cells, facilitating the observation of that drift. For PZT ferroelectric material, this relaxation time has been observed to occur within a time period of ten seconds at an elevated temperature of 85° C. It is contemplated that this relaxation time may vary with temperature, and that those skilled in the art having reference to this specification will be readily able to derive the appropriate in situ relaxation pause at a particular temperature for a particular material of interest, without undue experimentation.

Following the pause of process 50, the contents of sample groups of FRAM cells 48 in the DUT are read in process 52 over a range of reference voltages. It has been discovered that, in 1T-1C FRAM devices such as the FRAM cells in this embodiment, it is the first read of an FRAM cell following its programming and relaxation that is critical to detecting depolarization; the write-back process following a conventional read operation will restore the programmed state to that sensed in the read. One can therefore not accurately determine the extent of any depolarization of a given FRAM cell by performing a "shmoo" (i.e., repeated reads of the cell) over varying reference voltages, because only the first read following the programming and relaxation will provide an accurate indication of depolarization. According to this embodiment therefore, the test equipment is operated to determine the extent of depolarization of FRAM cells from the "1" data state programmed in process 48 in a sampled manner. More specifically, a sampled group of FRAM cells in the DUT is read at each of several reference voltage levels $V_{REF}(k)$ for the programmed "1" data state, for example a sequence of reference voltage levels $V_{REF}(k)$ varying at steps of about 5 mV from one to the next.

Figure 5A:
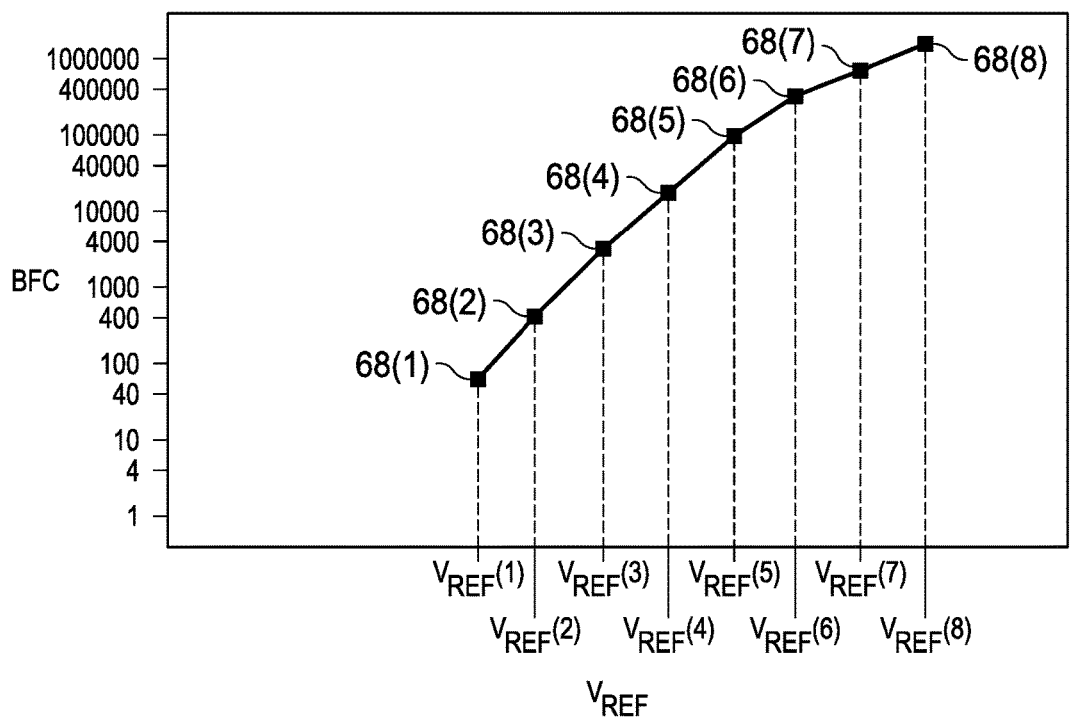
FIG. 5a is a plot of bit fail counts for an integrated circuit including 1T-1C FRAM cells versus reference voltage level, illustrating the operation of processes in the embodiment of FIG. 4.

FIG. 5a illustrates the plots of cumulative fail bit count for the "0" and "1" programmed data states over a sequence of reference voltage levels $V_{REF}(1)$ through $V_{REF}(8)$. It is contemplated that each of these reference voltage levels $V_{REF}(k)$ will be higher than the nominal reference voltage $V_{REF\_NOM}$ used to distinguish "0" and "1" data states in normal operation, as it is desired that one or more FRAM cells in a sample group should fail a read of a programmed "1" data state at each of those reference voltage levels $V_{REF}(k)$. It will be expected that higher reference voltage levels $V_{REF}(k)$ will cause more FRAM cells to fail the read of a "1" data state, as increasingly higher reference voltages require increasingly stronger "1" state read current. This dependence of the number of failing FRAM cells with reference voltage level $V_{REF}(k)$ will be used in identifying those cells and devices that are vulnerable to depolarization, as will now be described.

Referring back to FIG. 4, a first instance of read process 52 is performed at the elevated temperature following the pause of process 50. In this first instance, a first sample group of FRAM cells in the DUT are read at a first reference voltage level $V_{REF}(k)$, to determine the number of those cells that do not return the programmed "1" data state. In one implementation of this embodiment, a given sample group is constituted by FRAM cells along one or more rows of FRAM cells $2_{jk}$ in the array, where each row is constituted by those cells $2_{jk}$ that share the same word line $WL_j$. FIG. 5b illustrates an example of this implementation, in which FRAM array 70 is considered in blocks of eight rows. In this example, a first sample group WLG(1) of FRAM cells $2_{jk}$ are those in rows $WLG(1)_0$, $WLG(1)_1$, $WLG(1)_2$, and so on—namely the first row in each of the blocks of eight rows. In this first instance of read process 52, FRAM cells $2_{jk}$ in each row of this first sample group WLG(1) are read, using a reference voltage level $V_{REF}(1)$ applied by reference voltage generator 9 to sense amplifiers 8, according to the architecture of FIG. 2b. In process 54, the number of FRAM cells $2_{jk}$ in this first sample group WLG(1) that erroneously return a "0" data state are counted. In the example of FIG. 5a, reference voltage level $V_{REF}(1)$ is the lowest of the reference voltage levels $V_{REF}(k)$ applied in an instance of process 52, and the number of failed cells ("bits") at this reference voltage level $V_{REF}(1)$ is the left-most count 68(1).

Following the obtaining of the count in process 54, decision 55 determines whether additional reference voltage levels $V_{REF}(k)$, and thus additional sample groups WLG(k), remain to be read. If so (decision 55 is "yes"), index k is incremented in process 56, the next instance of read process 52 is performed for the next sample group WLG(k) at the next reference voltage level $V_{REF}(k)$, and the failed bit count 68(k) from that sample group WLG(k) at that level $V_{REF}(k)$ is obtained in process 54. Processes 52, 54, as well as decision 55 and incrementing process 56, are repeated in this manner until all desired reference voltage levels $V_{REF}(k)$ have been evaluated for their corresponding sample groups WLG(k), as indicated by decision 55 returning a "no" result.

The particular manner in which the FRAM cells in the DUT are sampled may vary from the row-based approach described above. It is contemplated, however, that organization of the sample groups according to row will generally be efficient from a test time standpoint. In addition, while the various sample groups need not include FRAM cells distributed across the array as in the example of FIG. 5b, it is contemplated that including cells from various locations of the array in each sample group will reduce the dependence of the results on the physical location of the cells in the device. Furthermore, while it is contemplated that including every FRAM cell in the DUT in one of the sample groups read in process 52 will provide the best results by maximizing the sample sizes of those groups, it is of course understood that not every FRAM cell need be included, for example to reduce test time.

Following the determination of fail bit counts over all desired $V_{REF}(k)$ levels (i.e., upon decision 55 returning a "no" result), a zero-fail-bit reference voltage $V_{REF}(0)$ is calculated for the DUT in process 58. In this embodiment, this zero-fail-bit reference voltage $V_{REF}(0)$ is calculated from the bit fail counts 68(k) over the evaluated reference voltage levels $V_{REF}(k)$ for the DUT, and as such is calculated specifically and separately for each die on the wafer under test, as each device will have different bit fail counts 68(k) depending on its particular vulnerability to depolarization. It is contemplated that the test equipment performing the test sequence will be capable of calculating the zero-fail-bit reference voltage $V_{REF}(0)$ in situ during that test sequence, for example by way of a curve fitting and extrapolation routine as may be carried out by way of conventional numerical processing.

Figure 5C:
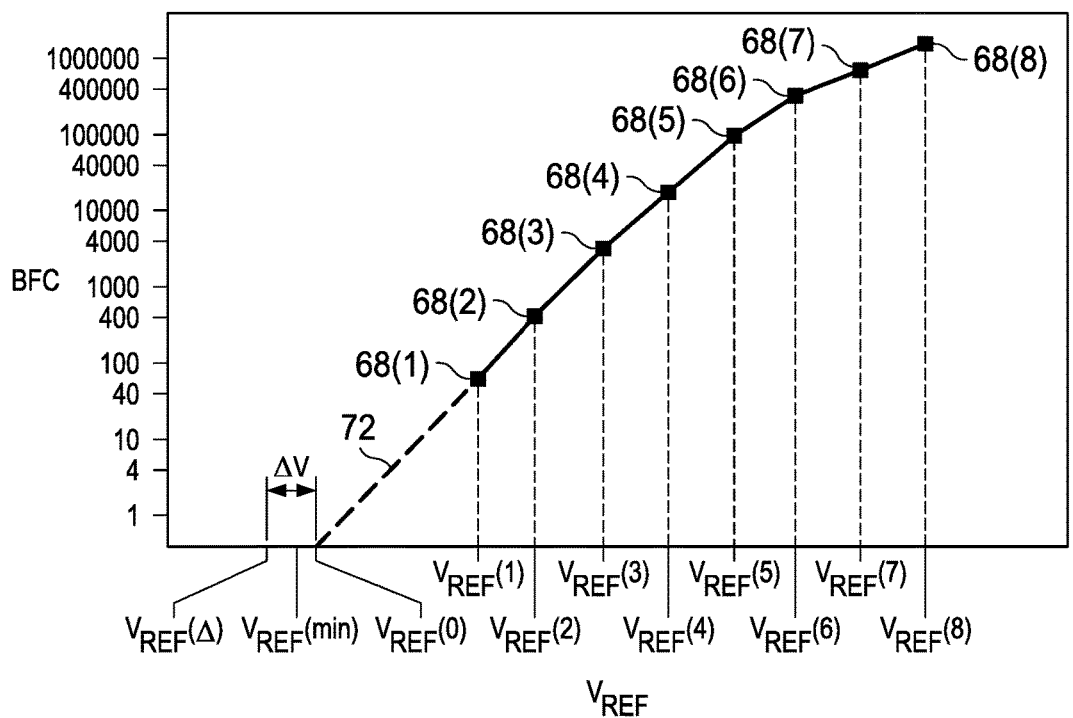
FIG. 5c is a plot illustrating the calculation of a test reference voltage for FRAM cells in an integrated circuit, according to the embodiment of FIG. 4.
Figure 5B:
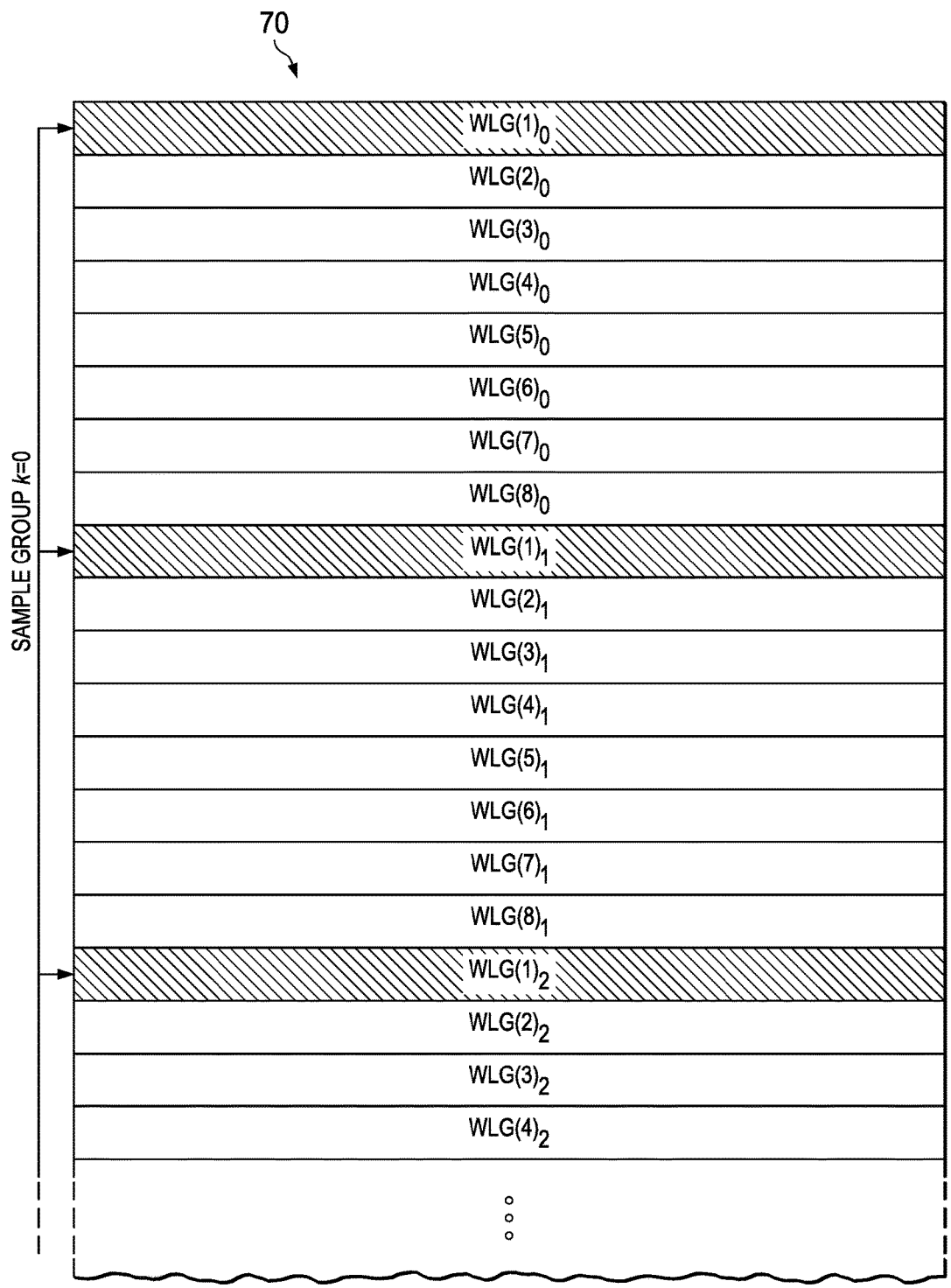
FIG. 5b is a block diagram illustrating the arrangement and selection of sampled FRAM cells in an array as involved in the test processes of the embodiment of FIG. 4.

FIG. 5c illustrates an example of calculation process 58, for the bit fail counts 68(k) shown in FIG. 5a. In this example, calculation process 58 performs a straight-line extrapolation along best-fit line 72 corresponding to several of the lower $V_{ref}(k)$ levels and thus the lower bit fail counts 68(k) obtained from the iterative processes 52, 54 for the DUT. In the example shown in FIGS. 5a and 5c, the lower four bit fail counts 68(1) through 68(4) are substantially linear along the semi-log scale of bit fail counts, and as such best-fit line 72 runs along these four bit fail counts 68(1) through 68(4) and is extended toward the zero bit fail count (BFC) value axis. Of course, no true "zero" bit fail count is defined on a semi-log scale of bit fail counts versus $V_{REF}$. As such, the zero-fail-bit reference voltage $V_{REF}(0)$ in this example of process 58 is calculated as the reference voltage $V_{REF}$ at which best-fit line 72 crosses a selected BFC value that is less than 1 (e.g., 0.1); in this case, the "zero" bit fail count is actually a non-zero bit fail count, and the corresponding zero-fail-bit reference voltage $V_{REF}(0)$ actually corresponds to a reference voltage at which a greater-than-zero bit fail count is expected.

As mentioned above, the manner in which the zero-fail-bit reference voltage $V_{REF}(0)$ is determined for the DUT by the test equipment may vary from the straight-line extrapolation shown in FIG. 5c. For example, a different curve-fitting and extrapolation routine may be used instead of the best-fit straight line, or a different particular bit fail count (BFC) value may be selected to determine the zero-fail-bit reference voltage $V_{REF}(0)$.

Referring back to FIG. 4, the zero-fail-bit reference voltage $V_{REF}(0)$ determined in process 58 is compared against a pass/fail threshold reference voltage level $V_{REF}$(min) in decision 59. Threshold reference voltage level $V_{REF}$(min) is a reference voltage that is previously determined, for example by characterization, experimentation, or simulation, to identify those devices that exhibit ferroelectric depolarization performance below a desired reliability standard—in other words, to identify those devices with too many FRAM cells with suspect reliability. In this manner, decision 59 determines whether the extrapolated zero-fail-bit reference voltage $V_{REF}(0)$ for a given DUT indicates that the number of failing bits in the iterative processes 52, 54 for that DUT is excessively high. Such high bit fail counts 68(k) would represent an excessive vulnerability to depolarization over the operating life of the device. If the zero-fail-bit reference voltage $V_{REF}(0)$ determined in process 58 is below the threshold reference voltage level $V_{REF}$(min) (i.e., decision 59 returns a "no" result), the DUT is considered to have failed the electrical test. Second multiprobe test 45 may then be considered as complete for this DUT.

If the zero-fail-bit reference voltage $V_{REF}(0)$ determined in process 58 meets the threshold minimum reference voltage level $V_{REF}$(min) (i.e., decision 59 returns a "yes" result), second multiprobe test 45 continues for that DUT, to identify those, if any, of its FRAM cells that are vulnerable to depolarization. Specifically, those vulnerable cells are those that exhibit depolarization to the extent that the higher polarization capacitance data state, after programming and relaxation at an elevated temperature, is not returned when read using a reference voltage $V_{REF}$ corresponding to the zero-fail-bit reference voltage $V_{REF}(0)$ determined in process 58. As described above in this embodiment in which FRAM cell $2_{jk}$ as shown in FIG. 1b is read by the application of a positive voltage across its capacitor 6, this higher polarization capacitance state is the C(−1) state shown in FIG. 1a. This "−1" polarization state is considered to be the "1" data state.

Accordingly in this embodiment, the remainder of second multiprobe test 45 begins with process 60, in which the FRAM cells $2_{jk}$ of the DUT are "preconditioned", specifically by first being programmed to a "0" data state followed by programming to a "1" data state, both at the same elevated temperature (e.g., above 60° C., such as at 85° C.) provided by the heated chuck used previously in second multiprobe test 45. Programming process 60 may program all FRAM cells $2_{jk}$ in the DUT to the "0" state first, and then program all FRAM cells $2_{jk}$ to the "1" data state. Alternatively, the order in which the FRAM cells of the device are programmed to the different data states may be altered (e.g., by programming some subset of cells to the "0" state and then the "1" state before programming the next subset to the "0" state) as appropriate, so long as all of the FRAM cells to be tested are programmed to a "0" state and then to the "1" state, in that order. Following programming process 60, a pause of at least about ten seconds with the wafer still at the elevated temperature is again observed, in process 62. As described above, this pause of process 62 allows a relaxation time for the newly programmed "1" data states at this elevated temperature, enabling the time dependent drift of the programmed states for those FRAM cells that are vulnerable to time-dependent depolarization.

Following the pause of process 62, the FRAM cells of the DUT are read at the elevated temperature in process 64, using a test reference voltage $V_{REF}(\Delta)$ that is based on and corresponds to the zero-fail-bit reference voltage $V_{REF}(0)$ determined in process 58 for that DUT. Referring to FIG. 5c for this embodiment, this test reference voltage $V_{REF}(\Delta)$ is determined by subtracting (for the "1" data state case) a margin $\Delta V$ from the zero-fail-bit reference voltage $V_{REF}(0)$. This margin $\Delta V$ allows for some level of statistical variance, to avoid excessive "false positives". It is contemplated that margin $\Delta V$ will typically be quite small, for example on the order of a few mV; of course, no such margin (i.e., $\Delta V=0$) need be applied, in which case test reference voltage $V_{REF}(\Delta)$ would be the same as the zero-fail-bit reference voltage $V_{REF}(0)$ calculated in process 58. In process 64, all FRAM cells of the DUT that were programmed to a "1" state in process 60 are read using this test reference voltage $V_{REF}(\Delta)$.

In decision 65, the test equipment determines whether any FRAM cells failed the read test of process 64, and if so, the number and address locations of those failing cells. If no failing cells were observed (decision 65 returns a "none" result), the DUT is considered to have passed the time zero reliability screen according to this embodiment. On the other hand, if the number of the FRAM cells failing the read of process 64, and the relative address locations of those failing cells, were below the limit of cells that can be "repaired" (more accurately, "replaced") by way of redundancy (i.e., if decision 65 returns a "<repair limit" result), that repair is carried out by way of process 66, and the device is considered to have passed. In this case, the manufacturer may consider the statistical likelihood that the redundant cells are also vulnerable to depolarization to be so low as to not require similar screening of those newly enabled cells, or alternatively a test sequence including the processes described above may be applied to these redundant cells. However, if the number or address locations of the failing FRAM cells preclude repair by way of redundancy (decision 65 returns a "> repair limit" result), the DUT is considered to have failed this reliability screen altogether.

In any case, once second multiprobe test 45 is complete for this specific die, the test equipment advances to a next die on the wafer, and carries out the reliability screen of second multiprobe test 45 for that next DUT in a similar manner as described above, beginning with process 48. This die-by-die testing continues in this manner until all devices on the wafer have been screened, following which the manufacture of the integrated circuits continues in the conventional manner, as appropriate for the desired end product.

According to the embodiments described above, a time-zero screen for ferroelectric devices is provided to identify, and remove or repair, those devices that are vulnerable to long-term reliability failures over their expected operating life. In particular, this embodiment enables the data retention capability of ferroelectric memories to be evaluated for all devices at the time of manufacture, and in an accurate manner that has been observed to capture those devices that will be vulnerable to loss of non-volatile data due to depolarization over the expected operating life. It is believed that the reliability screen of these embodiments will minimize the occurrence of both "false negatives" (i.e., devices that pass the screen but are in fact vulnerable to depolarization) and "false positives" (i.e., devices that fail the screen but are not in fact vulnerable to depolarization), as compared with conventional reliability screens and especially as compared with sampled testing. As a result, the overall reliability of the entire population of ferroelectric integrated circuits manufactured and installed into system applications is improved by these embodiments. It is contemplated that this improvement in data retention reliability for FRAM memories can facilitate the use of 1T-1C FRAM cells for applications that previously required 2T-2C or other cells with stronger read margin to ensure acceptable data retention performance, which results in the potential for significantly increased memory density and capacity and reduced cost in those circuits.

As described above in connection with the data retention reliability screen of FRAM cells, a test sequence is applied in which the reference voltage $V_{REF}$ is "shmooed" over sample groups of memory cells in the DUT. This sampled "shmoo" was discovered to be particularly useful in this application for ferroelectric memory cells, in that it is the first read of the cell following its programming and relaxation that is critical to detecting depolarization. As such, if a given cell were to itself be "shmooed" by testing that cell at multiple varying $V_{REF}$ values, one may not accurately determine the extent of any data retention weakness. It is contemplated that this sampled shmoo determination may be used to determine an appropriate test parameter value for parameters other than reference voltage $V_{REF}$, and indeed to determine test parameter values for other types of memory devices that are subject to potential data retention failures. Examples of such other memory devices include those of other non-volatile memory technologies (e.g., electrically-erasable-programmable read-only memory, or EEPROM), as well as dynamic random access memory (DRAM), static RAM (SRAM), and other volatile memory types. In this regard, it is contemplated that this sampled shmoo approach will be particularly useful for screening weakness in data retention, particularly in those situations such as that described above for 1T-1C FRAMs in which it is the drift in a particular parameter that is of interest, as opposed to an absolute or specification parameter value which may be determined for a particular integrated circuit by "shmooing" each cell to be tested. Accordingly, this approach is directed to the characterization of an individualized test parameter value for each integrated circuit device, on a device-by-device basis (i.e., each device in a population will be tested at its own test parameter value, with those values likely differing over the devices in the population).

Figure 6:
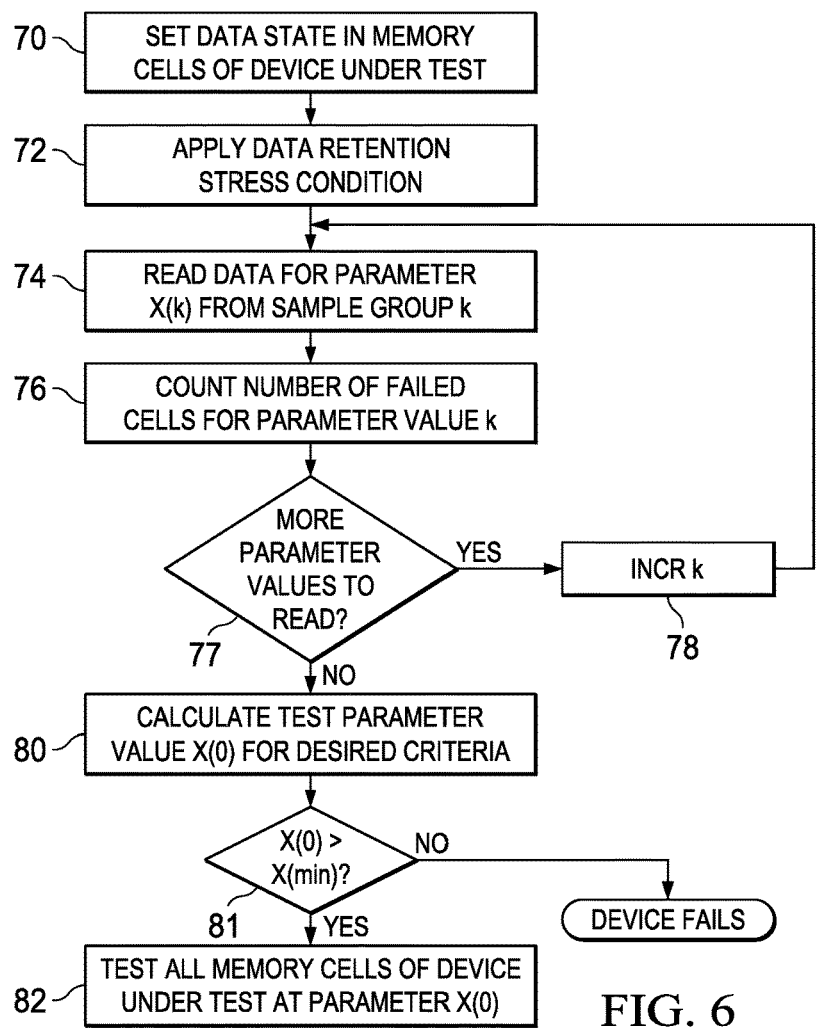
FIG. 6 is a flow diagram of a time-zero reliability screen according to another embodiment.

Referring now to FIG. 6, a more generalized data retention test process for use in connection with FRAM memories or other memory types will now be described according to an embodiment. As described above, it is contemplated that the test equipment being used to electrically test the integrated circuits will implement this test process on each integrated circuit device to be tested. In process 70, the memory cells in a device under test (DUT) are set to a desired data state, and in process 72, the DUT is subjected to a data retention stress condition. This data retention stress condition applied in process 72 is intended to cause or initiate the data retention mechanism addressed by this screen, and the setting of the desired data state in process 70 is intended to place the cells in a data state for which the mechanism can have a detectable effect in weak or vulnerable cells. For example, referring to the FRAM reliability screen described above, process 70 refers to the preconditioning of the FRAM cells to the "0" data state in process 42 of FIG. 4, and the data retention stress condition of process 72 refers to the baking of the wafer in process 44. The particular data state set (i.e., written or programmed) in process 70 depends on the particular memory technology and data retention failure mechanism, and may be a "0" state, a "1" state, a multi-bit state such as in some modern EEPROM memories, or a combination of data states varying by cell location, such as a checkerboard or the like. The particular data retention stress condition applied in process 72 is contemplated to include high temperature exposure such as described above, the application of stress voltages, and the like, and may involve a wait or pause under those conditions for an extended time.

In process 74, a sample group k of memory cells from the population of memory cells in DUT are read, for one parameter value X(k) of a predetermined set of values for the parameter X. The specific way in which the sampled read of process 74 is carried out, as well as the particular parameter X for which the value X(k) is applied, depends on the technology and the data retention mechanism being evaluated. Examples of parameters that may be applied in process 74 include read reference voltage levels, power supply or other bias voltage levels, signal timing (e.g., clock timing, cycle timing, set-up time, hold times, etc.), and programming voltage levels for the case of programmable non-volatile memories. For the example of the FRAM data retention screen described above, parameter X(k) corresponds to reference voltage $V_{REF}(k)$, and read process 74 corresponds to the preconditioning of process 48, pause process 50, and read process 52 of FIG. 4, with the sample group k corresponding to one or more rows of FRAM cells (i.e., cells sharing a common word line). In process 76, the number of memory cells in sample group k that failed the read test of process 74 for parameter value X(k) are counted. Decision 77 is performed to determine whether more values of parameter X, and thus more sample groups, are to be evaluated; if so (decision 77 is "yes"), the value of index k is advanced in process 78 and processes 74, 76 and decision 77 are repeated.

Once all sample groups have been evaluated (decision 77 is "no"), the test equipment executes process 80 to calculate a test parameter value X(0) for the DUT, based on the results of process 76 over all of the sample groups evaluated in process 74. Referring to the FRAM example described above, process 80 corresponds to the calculating of the zero-bit-fail reference voltage $V_{REF}(0)$ of process 58. Again, the particular test parameter value X(0) calculated in process 80 will depend on the particular memory technology and data retention failure mechanism being evaluated. In decision 81, test parameter value X(0) calculated in process 80 is compared against a minimum (or maximum, as the case may be) threshold value and, if the value X(0) for the DUT is inadequate, the DUT can be considered to fail the screen. If the calculated test parameter value X(0) meets the threshold criteria (decision 81 is "yes"), all cells in the DUT are tested in process 82, using the calculated test parameter value X(0) from process 80. Any failing cells or devices are repaired or considered to fail the screen, as the case may be, as described above.

According to this embodiment, the sampled shmoo characterization approach described in connection with FIG. 6 is capable of determining a test parameter value that is specific to that particular device among the population being screened, as opposed to the use of a particular parameter that is selected for all devices in the population, and thus vulnerable to errors of both the false positive and false negative types. It is contemplated that this screen may be used to screen devices in wafer form (i.e., at "multiprobe" test), as well as to screen packaged devices.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. For example, while the embodiments are generally described as applied to the screening of integrated circuits in wafer form (i.e., at multiprobe), it is also contemplated that these embodiments may be applied to packaged integrated circuits with ferroelectric memories; for those embodiments in which particular reference voltages are determined on a per-integrated circuit basis, it will be useful of course to track the identity of those individual packaged integrated circuits. In addition, other pass/fail criteria may be applied as may be determined from characterization and as data are gathered. In addition, while the embodiments are described above relative to the example of one binary data state, it is contemplated that the embodiments may readily be implemented for the opposite data state, using voltages complementary to those described herein. It is contemplated that these and other modifications and alternatives are within the scope of this invention as subsequently claimed herein.

What is claimed is:

1. A method for manufacturing a semiconductor device, the method comprising:
    forming a semiconductor die having ferroelectric memory cells;
    programming the ferroelectric memory cells to a first data state;
    after programming the ferroelectric memory cells to the first data state, baking the semiconductor die at a first temperature for a first selected duration;
    after baking the semiconductor die at the first temperature, programming the ferroelectric memory cells to a second data state while the semiconductor die is at a second temperature lower than the first temperature;
    after programming the plurality of ferroelectric memory cells to the second data state and while remaining at the second temperature:
        reading each of a plurality of sample groups of the ferroelectric memory cells at a respective one of a plurality of reference voltages to determine, at each of the plurality of reference voltages, a number of failed ferroelectric memory cells; and
        determining a test reference voltage from the numbers of failed ferroelectric memory cells at the plurality of reference voltages; and reading each of the plurality of ferroelectric memory cells at the test reference voltage;

determining a number of ferroelectric memory cells that failed in response to being read at the test reference voltage;

determining whether the number of ferroelectric memory cells that failed in response to being read at the test reference voltage exceeds a repair limit number;

identifying the semiconductor die as passing when the number of failed ferroelectric memory cells is less than the repair limit number and packaging the semiconductor die to form the semiconductor device.

2. The method of claim 1, comprising performing repair operation on the failed ferroelectric memory cells.

3. The method of claim 2, wherein the repair operation comprises activating redundant ferroelectric memory cells to replace the failed ferroelectric memory cells.

4. The method of claim 1, comprising identifying the semiconductor die as failing when the number of failed ferroelectric memory cells is greater than the repair limit number and not packaging the semiconductor die to form the semiconductor device.

5. The method of claim 1, comprising, after programming the plurality of ferroelectric memory cells to the second data state and before reading the plurality of sample groups of the ferroelectric memory cells at the plurality of reference voltages, pausing for a second selected duration with the semiconductor die at the second temperature.

6. The method of claim 5, wherein reading each of the plurality of ferroelectric memory cells at the test reference voltage comprises:

programming the plurality of ferroelectric memory cells to the first data state;

then programming the plurality of ferroelectric memory cells to the second data state;

then reading the plurality of ferroelectric memory cells at the test reference voltage.

7. The method of claim 6, wherein reading each of the plurality of ferroelectric memory cells at the test reference voltage further comprises:

after programming the plurality of ferroelectric memory cells to the second data state and before reading the plurality of programmed ferroelectric memory cells at the test reference voltage, pausing for a third selected duration with the semiconductor die at the second temperature.

8. The method of claim 7, wherein:

the first temperature is at least 85° C.;

the first selected duration is at least twenty minutes;

the second elevated temperature is at least 60° C.; and the second and third selected durations are each at least ten seconds.

9. The method of claim 1, wherein reading each of the plurality of ferroelectric memory cells at the test reference voltage comprises:

programming the plurality of ferroelectric memory cells to the first data state;

then programming the plurality of ferroelectric memory cells to the second data state;

then reading each of the plurality of ferroelectric memory cells at the test reference voltage.

10. The method of claim 9, wherein reading each of the plurality of ferroelectric memory cells at the test reference voltage further comprises:

after programming the plurality of ferroelectric memory cells to the second data state and before reading the plurality of programmed ferroelectric memory cells at the test reference voltage, pausing for a second selected duration with the semiconductor die at the second temperature.

11. The method of claim 10, wherein:

the first temperature is at least 85° C.;

the first selected duration is at least twenty minutes;

the second elevated temperature is at least 60° C.; and the second selected duration is at least ten seconds.

12. The method of claim 1, wherein determining the test reference voltage comprises:

extrapolating the numbers of failed ferroelectric memory cells at the plurality of reference voltages to determine a zero-fail-bit reference voltage; and determining the test reference voltage from the zero-fail-bit reference voltage.

13. The method of claim 12, further comprising:

comparing the zero-fail-bit reference voltage to a threshold reference voltage; and before reading the plurality of ferroelectric memory cells at the test reference voltage, and responsive to the zero-fail-bit reference voltage not meeting the threshold reference voltage, marking the semiconductor die as failing.

14. The method of claim 12, comprising applying a margin to the zero-fail-bit reference voltage to determine the test reference voltage.

15. The method of claim 14, wherein each of the plurality of ferroelectric memory cells is a the one transistor-one capacitor (1T-1C) cell;

wherein reading each of the plurality of ferroelectric memory cells at the test reference voltage comprises, for each ferroelectric memory cell:

coupling a first plate of a ferroelectric capacitor in the ferroelectric memory cell to a bit line associated with the ferroelectric memory cell; and comparing a voltage at the bit line with a reference voltage corresponding to the test reference voltage.

16. The method of claim 15, wherein the first data state corresponds to polarization of the ferroelectric capacitor to a first polarization state in which the capacitor retains a voltage of a first polarity in the absence of an applied voltage, and wherein reading further comprises biasing the second plate of the ferroelectric capacitor to a voltage, relative to the bit line, of a second polarity opposite the first polarity.

17. The method of claim 1, wherein the semiconductor die comprises an integrated circuit.

18. The method of claim 1, wherein:

the semiconductor die is part of a wafer comprising a plurality of semiconductor dies and the semiconductor die, if identified as passing, is separated from the wafer before packaging.

* * * * *